United States Patent
Shiramizu et al.

(10) Patent No.: US 7,821,335 B2
(45) Date of Patent: Oct. 26, 2010

(54) SEMICONDUCTOR INTEGRATED CIRCUIT WITH VARIABLE GAIN AMPLIFIER

(75) Inventors: Nobuhiro Shiramizu, Musashino (JP); Toru Masuda, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 36 days.

(21) Appl. No.: 12/252,554

(22) Filed: Oct. 16, 2008

(65) Prior Publication Data

US 2009/0102552 A1 Apr. 23, 2009

(30) Foreign Application Priority Data

Oct. 18, 2007 (JP) ............................. 2007-271119

(51) Int. Cl.
*H03F 1/24* (2006.01)
(52) U.S. Cl. ........................................ 330/98; 330/278
(58) Field of Classification Search ................... 330/98, 330/150, 310, 278, 307
See application file for complete search history.

(56) References Cited

U.S. PATENT DOCUMENTS

| | | | |
|---|---|---|---|
| 6,816,017 B2 * | 11/2004 | Yamashita et al. | 330/298 |
| 7,224,228 B2 * | 5/2007 | Takahashi et al. | 330/279 |
| 7,248,119 B2 | 7/2007 | Yamamoto | |
| 7,346,318 B2 * | 3/2008 | Tsutsui et al. | 455/127.4 |

FOREIGN PATENT DOCUMENTS

JP 2005-348101 A 12/2005

OTHER PUBLICATIONS

Bevilacqua, "An Ultrawideband CMOS Low-Noise Amplifier for 3.1-10.6 GHz Wireless Receivers" IEEE Journal of Solid-State Circuits, Vo. 39, No. 12, Dec. 2004, pp. 2259-2268.
Shiramizu et al. "A 3-10 GHz Bandwidth Low-Noise and Low-Power Amplifier for Full-Band UWB Communications in 0.25-μm SiGe BiCMOS Technology" 2005 IEEE Radio Frequency Integrated Circuits Symposium, pp. 39-42.
Garuda et al., "A-3-5 GHz Fully Differential CMOS LNA with Dual gain mode for Wireless UWB Applications", 2005, 48th Midwest Symposium on Circuits and Systems, Vol. 1, pp. 790-793, 7-10, Aug. 2005.

* cited by examiner

*Primary Examiner*—Henry K Choe
(74) *Attorney, Agent, or Firm*—Miles & Stockbridge P.C.

(57) ABSTRACT

The variable gain amplifier includes a bias circuit (BC) 1, a matching circuit (MC) 2, a variable gain resistive feedback amplifier (FA) 3 and an output follower (EA) 4. The resistance values of the load resistance Rc and feedback resistance Rf are changed in cooperation. In a case of making the load resistance Rc a high resistance to set the low noise amplifier to a high gain, the feedback resistance Rf is also made a high resistance, the feedback time constant $\tau fb(c1) \approx 2\pi \cdot RfCbe/(1+gmRc)$ of the closed loop of the resistive negative feedback amplifier 3 becomes substantially constant, and then the amplifier has a gain small in frequency dependency over a wide bandwidth. In a case of making the load resistance Rc a low resistance to set the low noise amplifier to a low gain, the feedback resistance Rf is also made a low resistance. The feedback resistance Rf with the low resistance increases the negative feedback quantity, and thus the amplifier is set to a low gain. Also, the load resistance Rc is made a low resistance, and the feedback time constant $\tau fb(c1)$ becomes substantially constant. The gain is not lowered further in a high frequency region.

20 Claims, 7 Drawing Sheets

SEMICONDUCTOR INTEGRATED CIRCUIT WITH VARIABLE GAIN AMPLIFIER

CLAIM OF PRIORITY

The present application claims priority from Japanese application JP 2007-271119 filed on Oct. 18, 2007, the content of which is hereby incorporated by reference into this application.

FIELD OF THE INVENTION

The invention relates to a semiconductor integrated circuit having therein a variable gain amplifier, which is mounted in a transceiver for wireless communication or wire communication. Particularly, it relates to a technique useful to offer a variable gain amplifier having a small gain dependent on the frequency over a wide bandwidth.

BACKGROUND OF THE INVENTION

In a receiver section of wireless or wire communication system, a low noise amplifier makes a first circuit block which has a gain first, and therefore the noise figure (NF) of the low noise amplifier is added into the noise figure of the system as it is. In the receiver section, the conjugate matching of the antenna and low noise amplifier is performed in order to attain a signal power as large as possible. Specifically, the low noise amplifier is designed so that it has a resistance component of input impedance of 50 ohms.

Non-patent Document 1, which is to be specified later, introduces various architectures of low noise amplifiers. It is stated that with the resistive termination technology of the first architecture, a low noise amplifier has a poor noise characteristic owing to a detrimental effect of the real resistance of an input port. As to the 1/gm termination method of the second architecture (also referred to as the common gate termination method), it is stated that bipolar transistors are more suitable to achieve a low noise figure performance than complementary metal oxide semiconductors (CMOS). In regard to the shunt series feedback of the third architecture, it is stated that electric power consumption is increased in comparison to other methods in case that the coordinative noise performance is achieved. With the inductive source degeneration method of the fourth architecture, a real part of the input impedance is created by using an inductor for a source terminal. According to the document it is stated that this method is often used together with a cascode transistor, and has been used widely in designing a low noise amplifier because of its good noise performance and reverse isolation, and a high gain being achievable.

Also, Non-patent Document 1 describes an inductive source degeneration low noise amplifier using both the cascode transistor and shunt feedback, and a fully differential low noise amplifier as an extension of the inductive source degeneration low noise amplifier. Further, Non-patent Document 1 contains the description that an N-type additional MOS transistor is connected in parallel with the cascode transistor for the purpose of materializing a variable gain of a low noise amplifier.

In addition, Non-patent Document 2, which is to be specified later, describes a inductive degeneration common source low noise amplifier used for an ultra wideband (UWB) system of 3.1 to 10.6 GHz. A cascode transistor is also used for the low noise amplifier. To enhance the design flexibility, an inductor is connected in series with the gate of a common source transistor, and a capacitance is connected between the gate and source of the transistor. In the low noise amplifier, a doubly terminated three-section passband Chebyshev filter is used to resonate with an inductive part of the input impedance over a whole bandwidth extending between 3.1 and 10.6 GHz. As a result, a total of five inductors are used in the low noise amplifier described in Non-patent Document 2.

Further, Non-patent Document 2 describes that the source of the common source transistor is connected to a substrate (bulk) for the purpose of enhancing the performance of the low noise amplifier. The common source transistor is an N channel MOS transistor, which is constructed by a triple well device. The triple well device uses a p-type substrate, an n-type well formed in the p-type substrate, and p-type well formed in the n-type well.

Non-patent Document 3, which is to be specified later, describes a low noise amplifier used for an ultra wideband (UWB) system of 3.1 to 10.6 GHz; the low noise amplifier uses two inductors, which is a relatively small figure. The low noise amplifier uses a heterojunction bipolar transistor of SiGe. The wideband input matching of this low noise amplifier is materialized in a common base input stage which enables a good noise matching impedance in an UWB frequency range up to 10.6 GHz. The common base input stage is identical in principle with the 1/gm termination method (common gate termination method) described in Non-patent Document 1. The emitter of a common base transistor is supplied with an RF input signal through a coupling capacitance, and the emitter of the common base transistor is connected to a ground voltage through an emitter biasing inductor, which is the first inductor, and a CR parallel circuit. A base bias voltage is applied to the base of the common base transistor through a base termination inductor, which is the second inductor. The rise in the base termination inductor increases the gain of the common base input stage until a resonance frequency decided by the product of the base termination inductance and the base input capacitance of the common base transistor. It is stated that the increase in the gain reduces the equivalent noise voltage, whereby the noise figure is improved. The gain stage making the second stage of this low noise amplifier is composed of a variable gain resistive feedback amplifier including a common emitter transistor, a collector load resistance, an emitter follower for feedback, and a feedback resistance. Also, the low noise amplifier includes an output emitter follower of the third stage.

On the other hand, Patent Document 1, which is to be specified later, describes a wideband amplifier having a transistor for amplifier, and a switch transistor connected to a base bias circuit of the transistor for amplifier, which is supplied with an OF/OFF switching voltage. When the switch transistor is in OFF state, the base bias voltage is higher, the collector current of the transistor for amplifier is larger, the negative feedback from the emitter toward the base is larger, and therefore the distortion is made smaller, which is suitable to amplify a strong electric field signal. When the switch transistor is in ON state, the base bias voltage is lower, the collector current of the transistor for amplifier becomes lower, the negative feedback from the emitter toward the base is smaller, and the gain is increased, and the noise figure is improved, which is suitable to amplify signals of weak and middle electric fields.

Now, the references cited herein are as follows.

Patent Document 1: JP-A-2005-348101.

Non-patent Document 1: Chetty Garuda et al, "A 3-5 GHz Fully Differential CMOS LNA with Dual-gain mode for Wireless UWB Application", 2005, 48th Midwest Symposium on Circuits and Systems, Vol. 1, pp. 790-793, 7-10, Aug. 2005.

Non-patent Document 2: Andrea Bevilacqua et al, "An Ultrawideband CMOS Low-Noise Amplifier for 3.1-10.6-GHz Wireless Receivers", IEEE JOURNAL OF SOLID-STATE CIRCUITS, VOL. 39, NO. 12, DECEMBER 2004, pp. 2259-2268.

Non-patent Document 3: Nobuhiro Shiramizu et al, "A 3-10 GHz Bandwidth Low-Noise and Low-Power Amplifier for Full-Band UWB Communications in 0.25-μm SiGe BiCMOS Technology", 2005 IEEE Radio Frequency Integrated Circuits Symposium, pp. 39-42.

SUMMARY OF THE INVENTION

Prior to the invention, the inventors had been engaged in research and development of a semiconductor integrated circuit used for an UWB communication system of multi-band orthogonal frequency division multiplexing (MB-OFDM).

The UWB frequencies are divided into first to fourteenth sub-bands; the first sub-band has a center frequency of 3432 MHz and a bandwidth of 528 MHz, and the fourteenth one has a center frequency of 10296 MHz and a bandwidth of 528 MHz. Therefore, a semiconductor integrated circuit used for UWB communication system supporting MB-OFDM is required to be operable to transmit and receive RF signals in an ultra wide bandwidth of about 3 to 10 GHz. As a result, the receiver section of an UWB communication system supporting MB-OFDM needs a low noise amplifier which amplifies UWB-RF received signals of about 3 to 10 GHz.

As stated in Non-patent Document 2, use of an inductive degeneration common source low noise amplifier with a three-section passband Chebyshev filter enables amplification of UWB-RF received signals over the whole bandwidth extending between about 3 and 10 GHz.

After the detailed examination of Non-patent Document 2, the inventors found the following from a photograph of the chip of the low noise amplifier described in the Non-patent Document 2.

That is, the low noise amplifier described in the Non-patent Document 2 needs three inductors of the three-section passband Chebyshev filter in addition to a degeneration inductor of the source terminal. Also, between the drain of the cascode MOS transistor and load resistance, an inductor of the drain terminal is connected. As a result, it was found that the chip footprint of five spiral inductors in total was extremely larger than the chip footprint of an active part of the cascode MOS transistor.

In addition, use of the low noise amplifier including a common base input stage making the first stage and a variable gain resistive feedback amplifier of the second stage as described in Non-patent Document 3 makes it possible to use a relatively small number of inductors to amplify UWB-RF received signals over the whole bandwidth extending between about 3 and 10 GHz.

On the other hand, as to an UWB communication system supporting MB-OFDM, the level of UWB-RF received signals varies largely depending on the environment in which the system is used. A low noise amplifier of the receiver section of an UWB communication system supporting MB-OFDM is required to amplify RF received signals varying from an extremely low level to an extremely high level. When the low noise amplifier cannot amplify an RF received signal of an extremely low level, the S/N ratio of an RF received and amplified signal supplied to a receiver mixer from the low noise amplifier is deteriorated. Further, in case that the RF received signal has reached an extremely high level, it is required to lower the gain of the low noise amplifier in response to this. Otherwise, distortion of the waveform owing to the waveform clipping of RF received and amplified signals at a load of the low noise amplifier will cause a demodulation error in OFDM demodulation.

Therefore, the inventors examined in the research and development of a semiconductor integrated circuit prior to the invention to add the gain switching function for eliminating the distortion of the waveform to an low noise amplifier as an extension of the low noise amplifier as described in Non-patent Document 3.

The inventors examined according to the analogy from the variable gain of the low noise amplifier as described in Non-patent Document 1 to switch, between High and Low, the collector load resistance of the common emitter transistor of the variable gain resistive feedback amplifier of the second stage. However, it was found from the result of simulation that when the collector load resistance is switched from a high resistance to a low resistance, the gain rises in a low frequency region and the gain drops in a high frequency region. The drop of the gain in a high frequency region causes the deterioration of the S/N ratio in the high frequency region.

Subsequently, the inventors examined according to the analogy from negative feedback quantity control in connection with the wide band amplifier as described in Patent Document 1 to switch, between High and Low, the feedback resistance between an output of the emitter follower of the variable gain resistive feedback amplifier and a base input of the common emitter transistor of the second stage. However, it was found from the result of simulation that when the feedback resistance is switched from a high resistance to a low resistance, the gain rises in a high frequency region and the gain drops in a low frequency region. The drop of the gain in a low frequency region causes the deterioration of the S/N ratio in the low frequency region.

FIG. 1 is a diagram showing a low noise amplifier arranged in a semiconductor integrated circuit (IC) 10, which the inventors examined prior to the invention. Like the low noise amplifier as described in Non-patent Document 3, the low noise amplifier of FIG. 1 includes: a matching circuit (MC) 2 composed of a common base input stage; a variable gain resistive feedback amplifier (FA) 3; an output emitter follower (EF) 4; and a bias circuit (BC) 1.

The common base transistor Q1 of the matching circuit 2 has an emitter, to which an RF input signal is supplied through an input terminal IN and a coupling capacitance C1. The emitter of the common base transistor Q1 is connected to the ground voltage GND through an emitter biasing inductor L1, which is the first inductor, and a CR parallel circuit C2 and R3. To the base of the common base transistor Q1, a base bias voltage is applied through a base termination inductor L2, which is the second inductor.

The base bias voltage is brought out from the node of bias resistances R1 and R2 connected in series between the power supply voltage Vcc and ground voltage GND in the bias circuit 1. Until the resonance frequency depending on the product of the base termination inductance L2 and the base input capacitance C1 of the common base transistor Q1, the increase in the base termination inductor L2 leads to the increase in the gain of the common base input stage of the matching circuit 2. The increase in the gain decreases the equivalent noise voltage, whereby the noise figure is improved.

The second gain stage of the low noise amplifier is composed of a variable gain resistive feedback amplifier 3 including a common emitter transistor Q2, a collector load resistance Rc, an emitter follower Q3 for feedback, and a feedback resistance Rf. An amplified signal from the variable gain resistive feedback amplifier 3 is passed through an output emitter follower 4 including an emitter follower transistor Q4 and an emitter resistance R6, and transferred to an output terminal OUT. The transistors Q1-Q4 of the low noise amplifier are each composed of a SiGe heterojunction bipolar transistor having a cutoff frequency $f_T$ about 90 GHz.

According to the analogy with Non-patent Document 1, the collector load resistance Rc for the common emitter transistor Q2 of the variable gain resistive feedback amplifier 3 of the second stage is switched between a high resistance for a high gain and a low resistance for a low gain as shown in FIG. 1. The high resistance for a high gain is 300 ohms, and the low resistance for a low gain is 220 ohms. In this case, the resistance value of the feedback resistance Rf is set to 1200 ohms.

FIG. 2 is a diagram showing gain dependence on frequency of the low noise amplifier when the collector load resistance Rc of the common emitter transistor Q2 of the low noise amplifier of FIG. 1 is switched between a high resistance and a low resistance. The results were gained from the simulation by a workstation. In FIG. 2, the characteristic curve High_Rc represents the dependence on frequency when the collector load resistance Rc is 300 ohms, and the characteristic curve Low_Rc represents the dependence on frequency when the collector load resistance Rc is 220 ohms. Specifically, when the collector load resistance Rc is switched from the high resistance 300 ohms to the low resistance 220 ohms, the gain drops in a high frequency region as shown by the characteristic curve Low_Rc of FIG. 2. The drop of the gain in a high frequency region causes the deterioration of the S/N ratio in the high frequency region.

According to the analogy with Patent Document 1, the feedback resistance Rf between the output of the emitter follower Q3 and the base input of the common emitter transistor Q2 of the variable gain resistive feedback amplifier 3 of the second stage is switched between a high resistance and a low resistance as shown in FIG. 1. The high resistance for a high gain is 1200 ohms, and the low resistance for a low gain is 700 ohms. In this case, the resistance value of the collector load resistance Rc is set to 300 ohms of the high resistance.

FIG. 3 is a diagram showing gain dependence on frequency of the low noise amplifier when the feedback resistance Rf of the variable gain resistive feedback amplifier 3 of FIG. 1 is switched between a high resistance and a low resistance. The results were gained from the simulation by a workstation. In FIG. 3, the characteristic curve High_Rf represents the dependence on frequency when the feedback resistance Rf is 1200 ohms, and the characteristic curve Low_Rf represents the dependence on frequency when the feedback resistance Rf is 700 ohms. Specifically, when the feedback resistance Rf is switched from the high resistance 1200 ohms to the low resistance 700 ohms, the gain drops in a low frequency region as shown by the characteristic curve Low_Rf of FIG. 3. The drop of the gain in a low frequency region causes the deterioration of the S/N ratio in the low frequency region.

The invention was made as a result of the examination by the inventors prior to the invention as described above. Therefore, it is an object of the invention to provide a novel variable gain amplifier. Also, it is another object of the invention to provide a variable gain amplifier having a small gain showing a frequency-dependency over a wide bandwidth.

Further, it is another object of the invention to provide a variable gain low noise amplifier having a small gain showing a frequency dependency over a wide bandwidth.

The above and other objects and novel features hereof will be clear from the description herein and the accompanying drawings.

Of the invention herein disclosed, the preferred embodiments will be described below briefly.

Specifically, with a variable gain resistive feedback amplifier (3) of a variable gain amplifier incorporated in a semiconductor integrated circuit according to a preferred embodiment of the invention, the resistance value of the load resistance (Rc) and the resistance value of the feedback resistance (Rf) are changed in cooperation in response to a gain control signal (Gv_Cnt).

In other words, the resistance value of the feedback resistance (Rf) is made large one in case that the resistance value of the load resistance (Rc) is made large one, and the resistance value of the feedback resistance (Rf) is made small one in case that the resistance value of the load resistance (Rc) is made small one.

Now, the effects achieved by the preferred embodiments of the invention herein disclosed will be described below briefly. That is, it is possible to provide a novel variable gain amplifier. Further, it is possible to provide a variable gain amplifier having a small gain showing a frequency dependency over a wide bandwidth.

DETAILED DESCRIPTION OF THE PREFERRED EMBODIMENTS

1. Summary of the Preferred Embodiments

Figure 1:
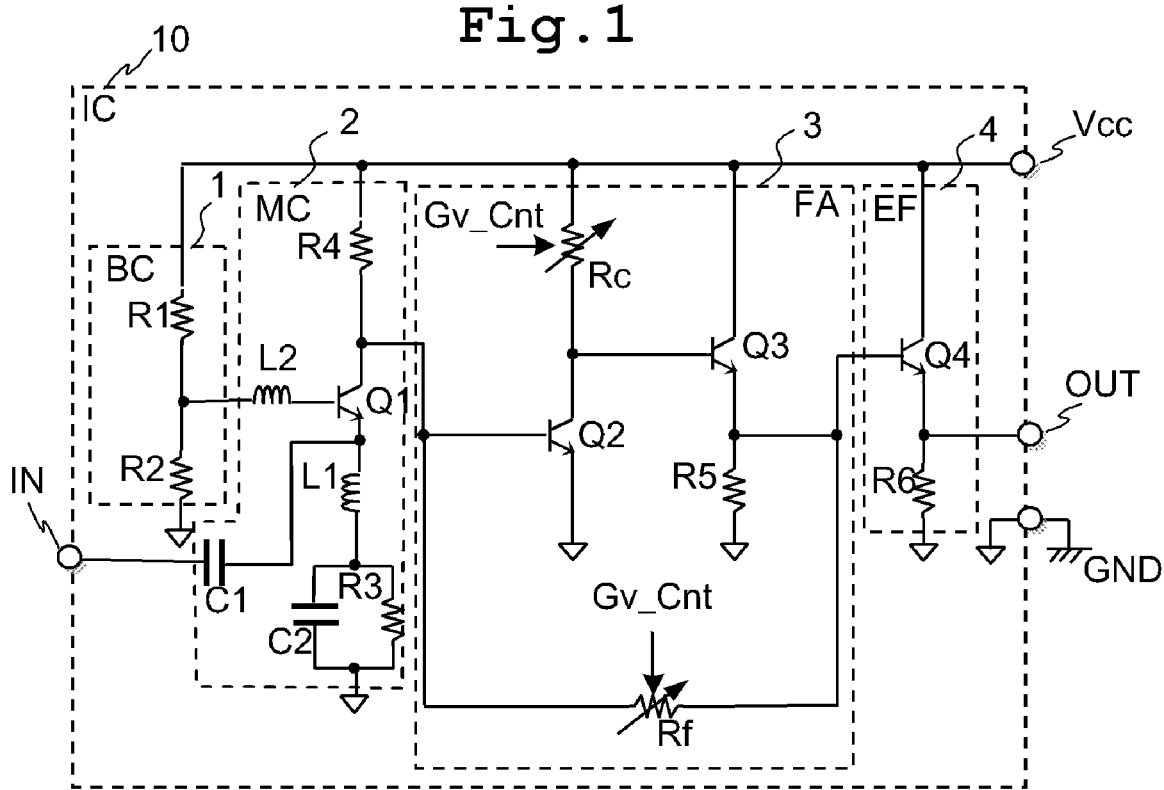
FIG. 1 is a diagram showing a low noise amplifier arranged in a semiconductor integrated circuit, which the inventors examined prior to the invention.

The preferred embodiments of the invention herein disclosed will be outlined first. The reference numerals and characters to refer to the drawings, which are accompanied with paired round brackets here, only exemplify what the concepts of components referred to by the numerals, characters and signs contain.

[1] A semiconductor integrated circuit according to a preferred embodiment of the invention has a variable gain resistive feedback amplifier (3) including: a transistor for amplifier (Q2); a load resistance (Rc); a voltage follower for feedback (Q3, R5); and a feedback resistance (Rf).

A common terminal of an emitter or a source of the transistor for amplifier (Q2) is connected to a predetermined reference voltage (GND).

An input signal is supplied to an input terminal of the base or gate of the transistor for amplifier (Q2).

The load resistance (Rc) is connected between an output terminal of the collector or drain of the transistor for amplifier (Q2) and a power supply voltage (Vcc).

To the output terminal of the transistor for amplifier (Q2) is connected an input of the voltage follower for feedback (Q3, R5).

The feedback resistance (Rf) is connected between an output of the voltage follower for feedback (Q3, R5) and the input terminal of the transistor for amplifier (Q2).

With the variable gain resistive feedback amplifier (3), the resistance values of the load resistance (Rc) and feedback resistance (Rf) are changed in cooperation in response to a gain control signal (Gv_Cnt).

In a case that the load resistance (Rc) is controlled to a high load resistance ($R_{CH}$) in response to the gain control signal (Gv_Cnt) for making the variable gain resistive feedback amplifier (3) a high gain, the feedback resistance (Rf) is also controlled to a high feedback resistance ($Rf_H$).

Figure 4:
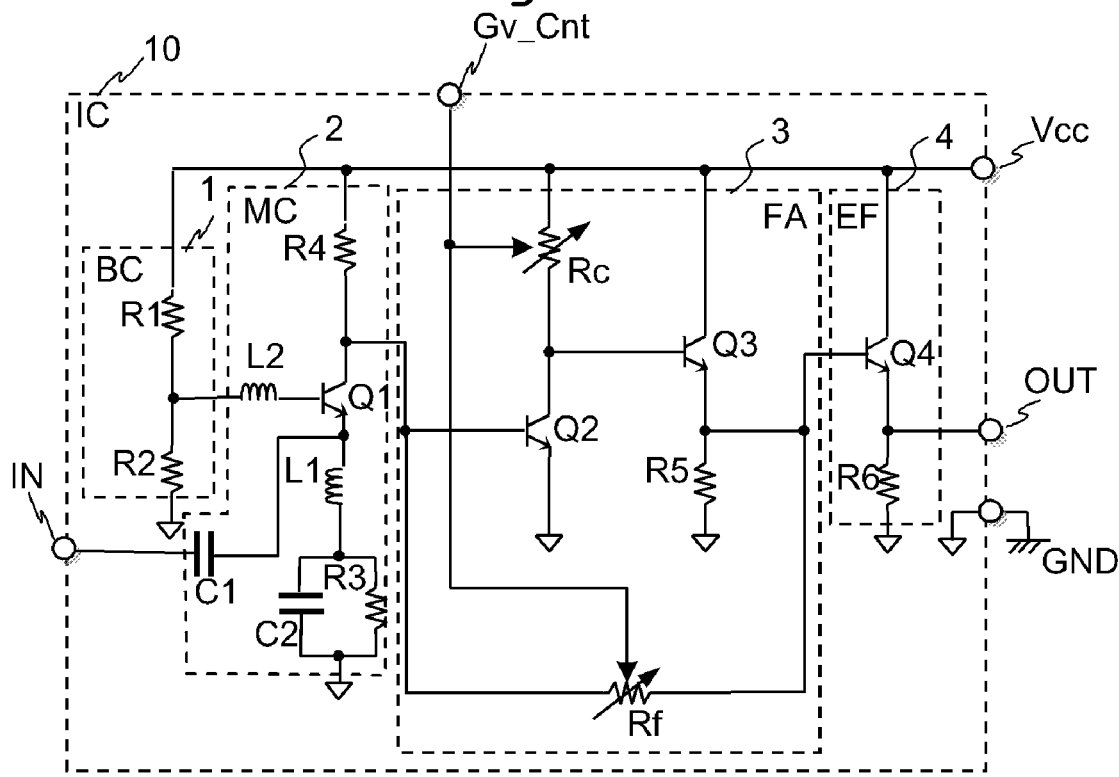
FIG. 4 is a drawing a diagram showing a low noise amplifier arranged in a semiconductor integrated circuit according to an embodiment of the invention.

In a case that the load resistance (Rc) is controlled to a low load resistance ($R_{CL}$) lower than the high load resistance ($R_{CH}$) in response to the gain control signal (Gv_Cnt) for making the variable gain resistive feedback amplifier (3) a low gain, the feedback resistance (Rf) is also controlled to a low feedback resistance ($Rf_L$) lower than the high feedback resistance ($Rf_H$) (see FIG. 4).

According to the above embodiment, in case that the variable gain resistive feedback amplifier (3) is made a high gain, the load resistance (Rc) is controlled to a high load resistance ($R_{CH}$) in response to a gain control signal (Gv_Cnt), and in parallel the feedback resistance (Rf) is also controlled to a high feedback resistance ($Rf_H$).

Therefore, as to a closed loop of the resistive negative feedback amplifier 3, both the numerator and denominator of the feedback time constant, which is expressed by $\tau fb(c1) \approx 2\pi f \cdot RfCbe/(1+gmRc)$, become large, and then the feedback time constant $\tau fb(c1)$ of the closed loop becomes substantially constant. Consequently, the frequency bandwidth according to the closed loop of the resistive negative feedback amplifier 3 hardly changes, and the gain in a high frequency region never drops. In addition, the feedback resistance Rf is made a high resistance, whereby the negative feedback quantity in a low frequency region is lowered and the gain in the region is increased.

Further, according to the above embodiment, in case that the variable gain resistive feedback amplifier (3) is made a low gain, the load resistance (Rc) is controlled to a low load resistance ($R_{CL}$) in response to a gain control signal (Gv_Cnt), and in parallel, the feedback resistance (Rf) is also controlled to a low feedback resistance ($Rf_L$)

Therefore, when the feedback resistance (Rf) is made a low feedback resistance ($Rf_L$), the negative feedback quantity in a low frequency region is increased, whereby the gain in the region is lowered. In addition, when the load resistance (Rc) is made a low load resistance ($R_{CL}$), both the numerator and denominator of the expression of the feedback time constant $\tau fb(c1)$ of the closed loop become small, and then the feedback time constant $\tau fb(c1)$ of the closed loop becomes substantially constant. Consequently, the frequency bandwidth according to the closed loop of the variable gain resistive feedback amplifier (3) is hardly changed and the gain in a high frequency region is never lowered further.

In addition, according to the above embodiment, an input of the voltage follower for feedback (Q3, R5) is connected to the output terminal of the transistor for amplifier (Q2), and the feedback resistance (Rf) is connected between an output of the voltage follower for feedback (Q3, R5) and the input terminal of the transistor for amplifier (Q2).

Therefore, the voltage follower for feedback (Q3, R5) makes possible to ensure the independence of the following two types of control from each other: open loop gain control of the variable gain resistive feedback amplifier (3) by controlling the resistance value of the load resistance (Rc); and negative feedback quantity control of the variable gain resistive feedback amplifier (3) by controlling the resistance value of the feedback resistance (Rf).

In a preferable embodiment of the invention, the input signal supplied to the input terminal of the transistor for amplifier (Q2) includes at least a signal of a frequency bandwidth extending between about 3 and 10 GHz.

In a more preferable embodiment of the invention, the transistor for amplifier (Q2) is a common emitter bipolar transistor, and the voltage follower for feedback includes an emitter follower bipolar transistor (Q3).

In an even more preferable embodiment of the invention, the common emitter bipolar transistor and the emitter follower bipolar transistor are each a silicon germanium (SiGe) heterojunction bipolar transistor.

In another more preferable embodiment of the invention, the transistor for amplifier (Q2) is a common source field effect transistor, and the voltage follower for feedback includes a source follower field effect transistor (Q3).

In still another more preferable embodiment of the invention, the common source field effect transistor and the source follower field effect transistor are each a MOS transistor.

In a specific embodiment of the invention, the resistance value squared of the high load resistance ($R_{CH}$) is substantially proportional to the resistance value of the high feedback resistance ($Rf_H$), and the resistance value squared of the low load resistance ($R_{CL}$) is substantially proportional to the resistance value of the low feedback resistance ($Rf_L$).

[2] A semiconductor integrated circuit according to a preferred embodiment in another aspect of the invention has: a matching circuit (2); and a variable gain resistive feedback amplifier (3) including a transistor for amplifier (Q2), a load resistance (Rc), a voltage follower for feedback (Q3, R5), and a feedback resistance (Rf).

The matching circuit (1) is supplied with an RF input signal received through antenna of a receiver of the wireless system.

A common terminal of an emitter or a source of the transistor for amplifier (Q2) is connected to a predetermined reference voltage (GND).

An output signal from the matching circuit (1) is supplied to an input terminal of a base or gate of the transistor for amplifier (Q2).

The load resistance (Rc) is connected between an output terminal of the collector or drain of the transistor for amplifier (Q2) and a power supply voltage (Vcc).

To the output terminal of the transistor for amplifier (Q2) is connected an input of the voltage follower for feedback (Q3, R5).

The feedback resistance (Rf) is connected between an output of the voltage follower for feedback (Q3, R5) and the input terminal of the transistor for amplifier (Q2).

With the variable gain resistive feedback amplifier (3), the resistance values of the load resistance (Rc) and feedback resistance (Rf) are changed in cooperation in response to a gain control signal (Gv_Cnt).

In a case that the load resistance (Rc) is controlled to a high load resistance ($R_{CH}$) in response to the gain control signal (Gv_Cnt) for making the variable gain resistive feedback amplifier (3) a high gain, the feedback resistance (Rf) is also controlled to a high feedback resistance ($Rf_H$).

In a case that the load resistance (Rc) is controlled to a low load resistance ($R_{CL}$) lower than the high load resistance ($R_{CH}$) in response to the gain control signal (Gv_Cnt) for making the variable gain resistive feedback amplifier (3) a low gain, the feedback resistance (Rf) is also controlled to a low feedback resistance ($Rf_L$) lower than the high feedback resistance ($Rf_H$) (see FIG. 4).

In a preferable embodiment of the invention, the matching circuit (1) includes a common base bipolar transistor (Q1) having a base fed with a base bias voltage, and an emitter supplied with the RF input signal which has been received through the antenna.

The RF input signal supplied to the emitter of the common base bipolar transistor (Q1) of the matching circuit (1) is an RF input signal of an ultra wide bandwidth including at least a frequency bandwidth extending about 3 to 10 GHz.

In a more preferable embodiment of the invention, the transistor for amplifier (Q2) is a common emitter bipolar transistor, and the voltage follower for feedback includes an emitter follower bipolar transistor (Q3).

In an even more preferable embodiment of the invention, the common base bipolar transistor, the common emitter bipolar transistor, and the emitter follower bipolar transistor are each a silicon germanium (SiGe) heterojunction bipolar transistor.

In another more preferable embodiment of the invention, the transistor for amplifier (Q2) is a common source field effect transistor, and the voltage follower for feedback includes a source follower field effect transistor (Q3).

In still another more preferable embodiment of the invention, the common source field effect transistor and the source follower field effect transistor are each a MOS transistor.

In a specific embodiment of the invention, the resistance value squared of the high load resistance ($R_{CH}$) is substantially proportional to the resistance value of the high feedback resistance ($Rf_H$), and the resistance value squared of the low load resistance ($R_{CL}$) substantially proportional to the resistance value of the low feedback resistance ($Rf_L$).

A semiconductor integrated circuit according to a more specific embodiment of the invention further includes an output voltage follower (4), a receiver mixer (45), a baseband signal processing unit (51), and a received signal strength indicator (48).

The output voltage follower (4) is supplied with an output signal of the variable gain resistive feedback amplifier (3).

The receiver mixer (45) is supplied with an output signal (OUT) of an output voltage follower (4).

The baseband signal processing unit (51) is supplied with a receiver baseband signal from the receiver mixer (45).

Figure 12:
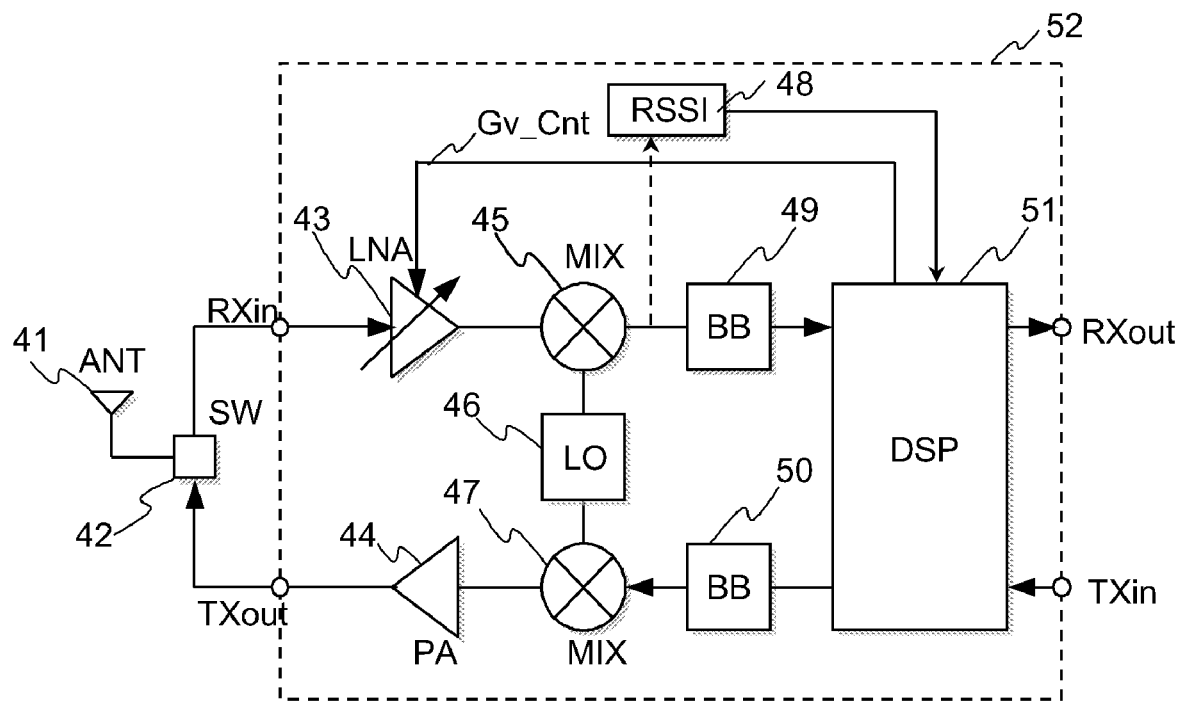
FIG. 12 is a diagram showing a structure of a UWB communication system of multi-band orthogonal frequency division multiplexing (MB-OFDM) according to another embodiment of the invention.

The received signal strength indicator (48) is supplied with the receiver baseband signal from the receiver mixer (45), whereby the gain control signal (Gv_Cnt) to be supplied to the variable gain resistive feedback amplifier (3) from the received signal strength indicator (48) is produced (see FIG. 12).

In a semiconductor integrated circuit according to another more specific embodiment of the invention, the output voltage follower (4) includes an output emitter follower bipolar transistor (Q4).

In a semiconductor integrated circuit according to one of the most specific embodiments of the invention, the output emitter follower bipolar transistor (Q4) is also a silicon germanium (SiGe) heterojunction bipolar transistor.

In a semiconductor integrated circuit according to another more specific embodiment of the invention, the output voltage follower (4) includes an output source follower field effect transistor (Q4).

In a semiconductor integrated circuit according to another most specific embodiment of the invention, the output source follower field effect transistor (Q4) is also a MOS transistor.

2. Further Detailed Description of the Preferred Embodiments

Now, further detailed description of embodiments will be presented. The best mode for embodying the invention will be described below in detail with reference to the drawings. In all the drawings to which reference is made in describing the best mode for embodying the invention, the members having identical functions are identified by the same reference numeral, character or sign and the iteration of the description is omitted.

<<Structure of MB-OFDM Supporting Low Noise Amplifier>>

FIG. 4 is a drawing a diagram showing a low noise amplifier arranged in a semiconductor integrated circuit (IC) 10 according to an embodiment of the invention. Like the low noise amplifier of FIG. 1, the low noise amplifier of FIG. 4 includes: a matching circuit (MC) 2 composed of a common base input stage; a variable gain resistive feedback amplifier (FA) 3; an output emitter follower (EA) 4; and a bias circuit (BC) 1.

To an emitter of the common base transistor Q1 of the matching circuit 2, an RF input signal received through the antenna of the receiver of the wireless system is supplied through an input terminal IN and a coupling capacitance C1. The emitter Q1 of the common base transistor is connected to the ground voltage GND through an emitter biasing inductor L1, which is the first inductor, and a CR parallel circuit C2 and R3.

The RF input signal is a UWB frequency signal belonging to one of the first sub-band having a center frequency of 3432 MHz and a bandwidth of 528 MHz to the fourteenth sub-band having a center frequency of 10296 MHz and a bandwidth of 528 MHz. Incidentally, the coupling capacitance C1 is set to a capacitance value of 5 pF, and the emitter biasing inductor L1 is set to have an inductance of 5 nH. The capacitance C2 and resistance R3 of the CR parallel circuit are set to a capacitance value of 5 pF and a resistance value of 400 ohms, respectively. The high impedance of the emitter biasing inductor L1 in an RF frequency bandwidth reduces, of the RF input signal supplied to the input terminal IN, an RF leak component leaking out to the ground voltage GND.

To the base Q1 of the common base transistor, a base bias voltage is applied through a base termination inductor L2, which is the second inductance. The base termination inductor L2 is set to an inductance of 0.3 nH, and the base bias voltage is set to 1.66 volts.

The base bias voltage is brought out from the node of bias resistances R1 and R2 connected in series between the power supply voltage Vcc and ground voltage GND in the bias circuit 1. Until the resonance frequency depending on the product of the base termination inductance L2 and the base input capacitance C1 of the common base transistor Q1, the increase in the base termination inductor L2 leads to the increase in the gain of the common base input stage of the matching circuit 2. The increase in the gain decreases the equivalent noise voltage, whereby the noise figure is improved.

The second gain stage of the low noise amplifier is composed of a variable gain resistive feedback amplifier 3 including a common emitter transistor Q2, a collector load resistance Rc, an emitter follower Q3 for feedback, and a feedback resistance Rf. An amplified signal from the variable gain resistive feedback amplifier 3 is passed through an output emitter follower 4 including a transistor Q4 and an emitter resistance R6, and transferred to an output terminal OUT. The transistors Q1-Q4 of the low noise amplifier are each composed of a SiGe heterojunction bipolar transistor having a cutoff frequency $f_T$ about 90 GHz. The emitter biasing inductor L1 and base termination inductor L2 are each composed of an on-chip spiral inductor on the semiconductor integrated circuit with the SiGe heterojunction bipolar transistors constructed thereon.

With the low noise amplifier arranged in the semiconductor integrated circuit 10 of FIG. 4, the resistance values of the collector load resistance Rc and feedback resistance Rf are changed in cooperation by a gain control signal Gv_Cnt supplied to a control input terminal of the semiconductor integrated circuit 10.

Specifically, the resistance value of the feedback resistance Rf is made large in case that the resistance value of the collector load resistance Rc is made large according to the gain control signal Gv_Cnt of a low level, whereas the resistance value of the feedback resistance Rf is made small in case that the resistance value of the collector load resistance Rc is made small according to a gain control signal Gv_Cnt of a high level. The large and small resistance values of the collector load resistance Rc are set to 300 and 220 ohms, respectively. The large and small resistance values of the feedback resistance Rf are set to 1200 and 700 ohms, respectively. The collector load resistance Rc and feedback resistance Rf, which are controlled to the respective large and small resistance values, may be arranged, for example, as shown in FIG. 10.

Figure 10:
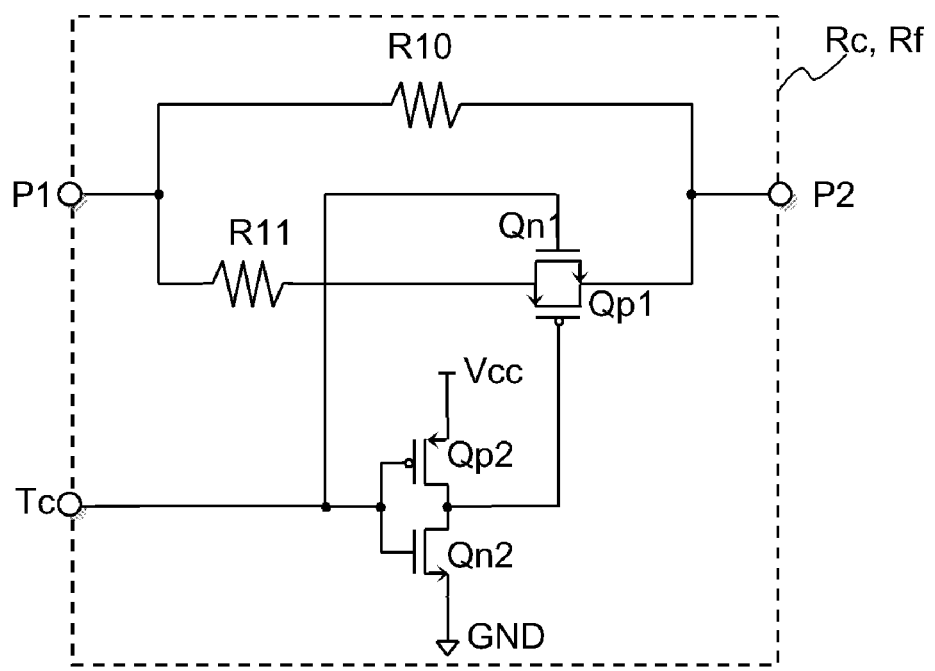
FIG. 10 is a diagram showing a structure of a variable resistor used for the collector load resistance Rc and feedback resistance Rf of the low noise amplifier arranged in the semiconductor integrated circuit of FIG. 4.

FIG. 10 is a diagram showing a structure of a variable resistor used for the collector load resistance Rc and feedback resistance Rf of the low noise amplifier arranged in the semiconductor integrated circuit 10 of FIG. 4.

As shown in FIG. 10, a first resistance R10 is connected between one side terminal T1 of the variable resistor and the other side terminal T2. Also, between the terminals, a second resistance R11 and a CMOS analog switch are connected in series. The CMOS analog switch is composed of a combination of an N channel MOS transistor Qn1 and a P channel MOS transistor Qp1, which are set to have a small on-resistance and connected in parallel.

The gate of the N channel MOS transistor Qn1 of the CMOS analog switch is directly driven by a control signal coming through the control input terminal Tc, whereas the gate of the P channel MOS transistor Qp1 of the CMOS analog switch is driven by an inverted output signal from an inverter which has been supplied, through its input, with a control signal from the control input terminal Tc.

In a case that the control signal coming through the control input terminal Tc is at its low level, the CMOS analog switch is turned off, and the resistance between the one side terminal T1 of the variable resistor and the other side terminal T2 is made a high resistance by the first resistance R10.

In a case that the control signal coming through the control input terminal Tc is at its high level, the CMOS analog switch is turned on, and the resistance between the one side terminal T1 of the variable resistor and the other side terminal T2 is made a low resistance by a combination of the first resistance R10 and second resistance R11 connected in parallel. Now, it is noted that the inverter is a CMOS inverter composed of a combination of a P channel MOS transistor Qp2 and an N channel MOS transistor Qn2 connected in series between the power supply voltage Vcc and ground voltage GND.

As stated above, in the low noise amplifier arranged in the semiconductor integrated circuit 10 of FIG. 4, the resistance value of a collector load resistance Rc and the resistance value of the feedback resistance Rf are changed, in cooperation, by the gain control signal Gv_Cnt supplied to the control input terminal of the semiconductor integrated circuit 10.

Specifically, in case that the resistance value of a collector load resistance Rc is made large, i.e. 300 ohms, by the gain control signal Gv_Cnt of the low level, the resistance value of the feedback resistance Rf is made large, i.e. 1200 ohms. In addition, in case that the resistance value of a collector load resistance Rc is made small, i.e. 220 ohms, by the gain control signal Gv_Cnt of the high level, the resistance value of the feedback resistance Rf is made small, i.e. 700 ohms.

In a case that both the resistance value of a collector load resistance Rc and the resistance value of the feedback resistance Rf are made large by the gain control signal Gv_Cnt of the low level, the low noise amplifier is controlled to a high gain condition. In a case that both the resistance value of a collector load resistance Rc and the resistance value of the feedback resistance Rf are made small by the gain control signal Gv_Cnt of the high level, the low noise amplifier is controlled to a low gain condition.

<<Frequency Dependence of Gain of Low Noise Amplifier>>

Figure 5:
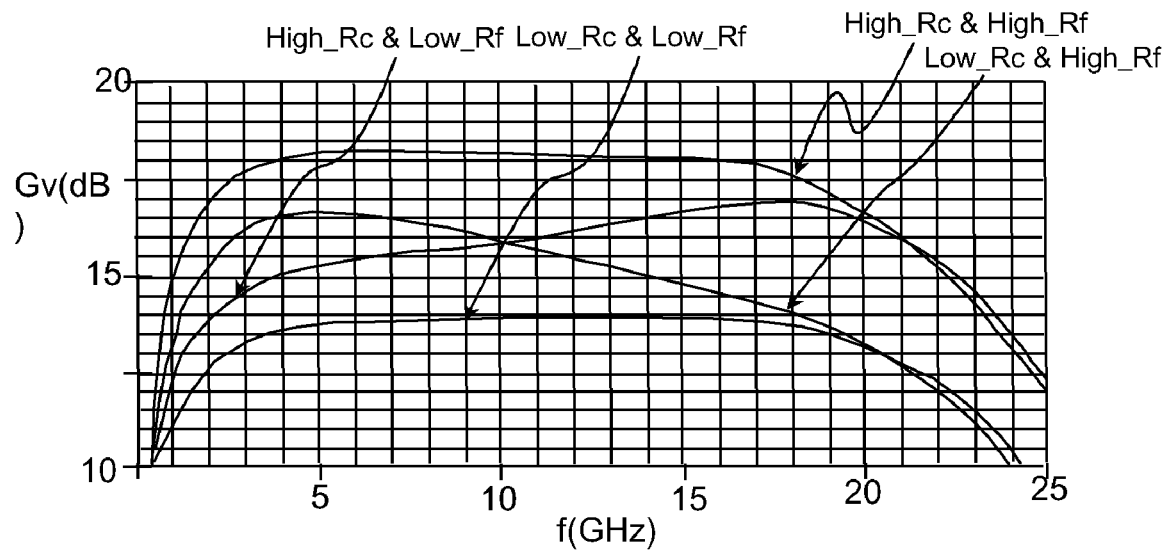
FIG. 5 is a diagram showing frequency dependence of the gain of the low noise amplifier arranged in the semiconductor integrated circuit of FIG. 4 in case that the value of the gain is changed by a gain control signal between large and small ones;.

FIG. 5 is a diagram showing gain dependence on frequency of the low noise amplifier arranged in the semiconductor integrated circuit 10 of FIG. 4 in case that the value of the gain is changed by a gain control signal Gv_Cnt between large and small ones. The results were also gained from the simulation by the workstation.

Figure 2:
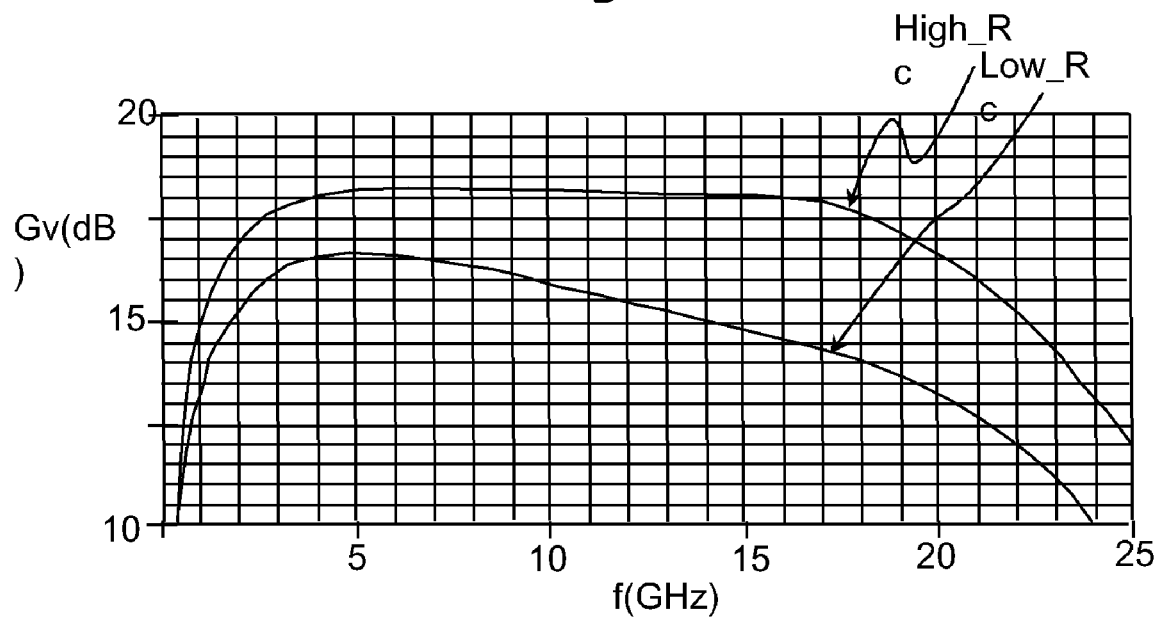
FIG. 2 is a diagram showing gain dependence on frequency of the low noise amplifier when the collector load resistance of the common emitter transistor of the low noise amplifier of FIG. 1 is switched between a high resistance and a low resistance.
Figure 3:
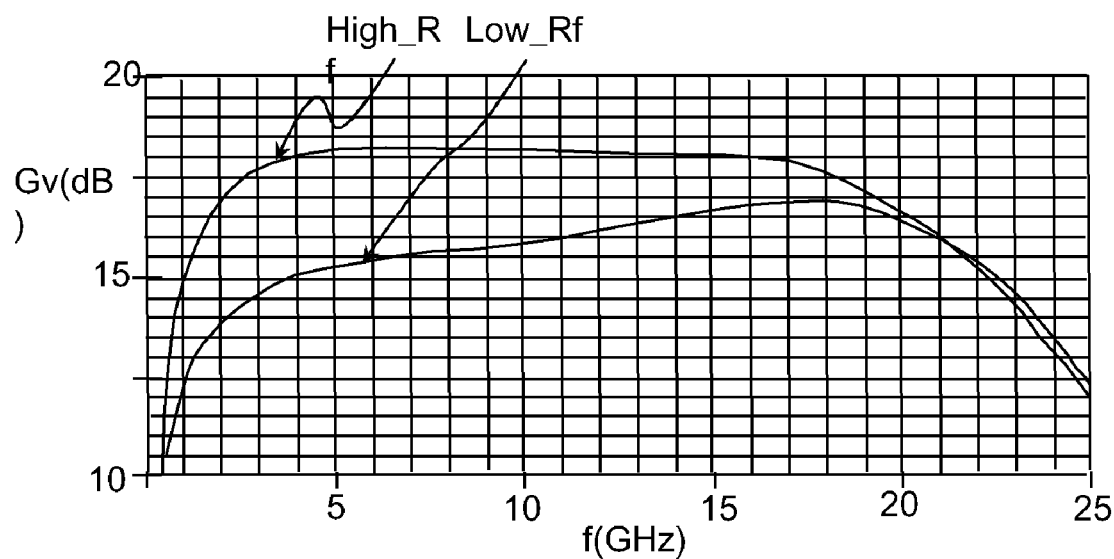
FIG. 3 is a diagram showing gain dependence on frequency of the low noise amplifier when the feedback resistance of the variable gain resistive feedback amplifier of FIG. 1 is switched between a high resistance and a low resistance.

The characteristic curve High_Rc & High_Rf of FIG. 5 represents the dependence on frequency in the high gain condition in a case of the collector load resistance Rc of the large resistance 300 ohms and the feedback resistance Rf of the large resistance 1200 ohms. The characteristic curve High_Rc & High_Rf of FIG. 5 corresponds to the characteristic curve High_Rc of FIG. 2 and the characteristic curve High_Rf of FIG. 4. The characteristic curve High_Rc & High_Rf of FIG. 5 shows a very good high-gain dependence on frequency that the 3-dB-down frequency bandwidth extends between about 1 and 22.5 GHz, which makes an ultra wide bandwidth, and the curve is kept substantially flat between about 5 and 17 GHz.

The characteristic curve Low_Rc & Low_Rf of FIG. 5 represents the dependence on frequency in the low gain condition in a case of the collector load resistance Rc of the small resistance 220 ohms and the feedback resistance Rf of the small resistance 700 ohms. The characteristic curve Low_Rc & Low_Rf of FIG. 5 shows a very good low-gain dependence on frequency that the 3-dB-down frequency bandwidth extends between about 1 and 24 GHz, which makes an ultra wide bandwidth, and the curve is kept substantially flat between about 5 and 17 GHz.

In contrast to them, in FIG. 5 are shown the characteristic curve Low_Rc & High_Rf when the collector load resistance Rc is the small resistance 220 ohms and the feedback resistance Rf is the large resistance 1200 ohms, and the characteristic curve High_Rc & Low_Rf when the collector load resistance Rc is the large resistance 300 ohms, and the feedback resistance Rf is the small resistance 700 ohms.

As to the characteristic curve Low_Rc & High_Rf of FIG. 5, it can be understood that the 3-dB-down frequency bandwidth is relatively narrow ranging from about 1 to 19 GHz, and the drop of the gain is larger particularly in a frequency region of not less than about 5 GHz. Incidentally, the characteristic curve Low_Rc & High_Rf of FIG. 5 corresponds to the characteristic curve Low_Rc of FIG. 2. As to the characteristic curve High_Rc & Low_Rf of FIG. 5, it can be understood that the 3-dB-down frequency bandwidth is relatively wide ranging about 2 to 23.5 GHz, however the drop of the gain is larger particularly in a frequency region of not more than about 18 GHz. Incidentally, the characteristic curve High_Rc & Low_Rf of FIG. 5 corresponds to the characteristic curve Low_Rf of FIG. 4.

Figure 6:
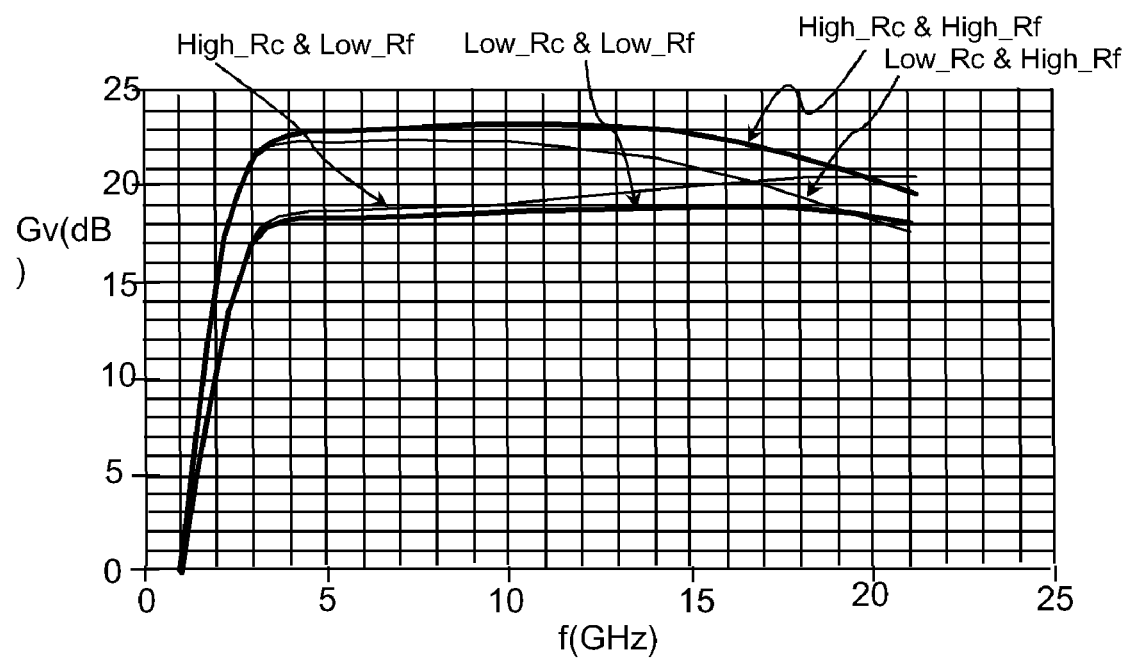
FIG. 6 is a diagram showing frequency dependence of the gain of the low noise amplifier arranged in the semiconductor integrated circuit of FIG. 4 in case that the value of the gain is changed by a gain control signal between large and small ones.

Also, FIG. 6 is a diagram showing frequency dependence of the gain of the low noise amplifier arranged in the semiconductor integrated circuit 10 of FIG. 4 in case that the value of the gain is changed by a gain control signal Gv_Cnt between large and small ones.

However, FIG. 6 is a diagram showing the results of simulation in which a personal computer is used to simulate instead of a workstation and the transistor model is simplified in order to facilitate reproducing the results. The degree of gain dependence on frequency shown in FIG. 6 is smaller than that of the gain shown in FIG. 5, however the their tendencies are precisely identical.

The tendencies as shown in FIG. 5, i.e. a tendency of the characteristic curve Low_Rc & High_Rf when the collector load resistance Rc is made a low resistance and the feedback resistance Rf is made a high resistance that the gain decreases in a high frequency region, and a tendency of the characteristic curve High_Rc & Low_Rf when the collector load resistance Rc is made a high resistance and the feedback resistance Rf is made a low resistance that the gain increases in a low frequency region, can be explained as described below.

<<Mechanism of Gain Depending on Frequency>>

As is well known, the closed loop transfer function of a negative feedback system composed of a feed-forward of a transfer function H(s) and a feedback of a transfer function G(s) is equivalent to the result of the division of the feed-forward transfer function H(s) by (1+H(s)G(s)), as expressed by H(s)/(1+H(s)G(s)).

The feed-forward transfer function H(s) of the resistive negative feedback amplifier 3 of the low noise amplifier arranged in the semiconductor integrated circuit 10 of FIG. 4 is gmRc, where gm is a conductance of the ratio ΔIc/ΔVbe of the change in collector current Ic with respect to the change in base-emitter voltage Vbe of the common emitter transistor Q2, and Rc represents the resistance value of a collector load resistance Rc of the common emitter transistor Q2. The feedback transfer function G(s) of the resistive negative feedback amplifier 3 in a range of a direct current operation region to a low-frequency operation region becomes G(s)≈1. This is because the impedance of the base-emitter capacitance Cbe (about 50 fF) of the common emitter transistor Q2 is much larger than the impedance of the feedback resistance Rf in this operation frequency region.

On the other hand, the feedback time constant τfb(op) of open loop of the resistive negative feedback amplifier 3 of the low noise amplifier arranged in the semiconductor integrated circuit 10 of FIG. 4 becomes τfb(op)≈2π·RfCbe. Therefore, the closed loop feedback time constant τfb(c1) of the resistive negative feedback amplifier 3 of the low noise amplifier is τfb(c1)=τfb(op)/(1+H(s)G(s)).

Hence, the closed loop feedback time constant τfb(c1) of the resistive negative feedback amplifier 3 is as follows.

$$\tau fb(c1) \approx 2\pi \cdot RfCbe/(1+gmRc) \qquad \text{Expression (1)}$$

As shown by the characteristic curve Low_Rc & High_Rf of FIG. 5, the numerator and denominator of Expression (1) are made large and small respectively by making the collector load resistance Rc a low resistance and the feedback resistance Rf a high resistance, and then the closed loop feedback time constant τfb(c1) given by Expression (1) is made larger. As a result, the frequency bandwidth depending on the closed loop of the resistive negative feedback amplifier 3 is made smaller, and the gain in a high frequency region is decreased. However, the feedback resistance Rf is made a high resistance, whereby the negative feedback quantity in the low frequency region is decreased and the gain in the low frequency region is increased.

As shown by the characteristic curve High_Rc & Low_Rf of FIG. 5, the collector load resistance Rc is made a high resistance, and the feedback resistance Rf is made a low resistance, whereby the numerator and denominator of Expression (1) are made small and large respectively, and the closed loop feedback time constant τfb (c1) given by Expression (1) is made smaller. As a result, the frequency bandwidth depending on the closed loop of the resistive negative feedback amplifier 3 is made large and the gain in a high frequency region is increased. However, the feedback resistance Rf is made a low resistance, whereby the negative feedback quantity in the low frequency region is increased and the gain in the low frequency region is decreased.

As shown by the characteristic curve High_Rc & High_Rf of FIG. 5, the gain of the open loop of the resistive negative feedback amplifier 3 is increased by making the collector load resistance Rc a high resistance. Also, the collector load resistance Rc is made a high resistance, and the feedback resistance Rf is made a high resistance, whereby both the numerator and denominator of Expression (1) are made large, the closed loop feedback time constant τfb(c1) given by Expression (1) is made substantially constant. As a result, the frequency bandwidth depending on the closed loop of the resistive negative feedback amplifier 3 is hardly changed, and the gain is never decreased in a high frequency region. In addition, the negative feedback quantity in a low frequency region is lowered by making the feedback resistance Rf a high resistance, and the gain is increased in the low frequency region.

As shown by the characteristic curve Low_Rc & Low_Rf of FIG. 5, the feedback resistance Rf is made a low resistance, whereby the negative feedback quantity in a low frequency region is increased and the gain in the low frequency region is decreased. In addition, the collector load resistance Rc is made a low resistance, whereby both the numerator and denominator of Expression (1) are made small, and the closed loop feedback time constant τfb(c1) given by Expression (1) is made substantially constant. As a result, the frequency bandwidth depending on the closed loop of the resistive negative feedback amplifier 3 is hardly changed, and the gain is never further decreased below it in a high frequency region.

The following relations hold between the 300-ohm high collector resistance $R_{CH}$ and the 1200-ohm high feedback resistance $Rf_H$ and between the 220-ohm low collector resistance $R_{CL}$ and 700-ohm low feedback resistance $Rf_L$, respectively.

$$R_{CH}^2 = \alpha_H \cdot Rf_H \quad \text{Expression (2)}$$

$$R_{CL}^2 = \alpha_L \cdot Rf_L \quad \text{Expression (3)}$$

When values are substituted in the above Expressions actually, the following relation holds as $\alpha_H = 90000/1200 = 75$, and $\alpha_L = 48400/700 = 69.14$.

$$\alpha_H \approx \alpha_L \quad \text{Expression (4)}$$

This expression is not derived from Expression (1), which is the approximate expression of the feedback time constant τfb(c1), but computed with a higher accuracy by performing simulation on a complicated transfer function expression taking into account a parasitic element of the circuit of FIG. 4. Designing the resistance values at the time of the high gain and the time of the low gain according to Expressions (2), (3) and (4) respectively rather than making the ratio between Rc and Rf constant according to the approximate expression (1), can enlarge a frequency range that the gain becomes substantially flat in the high and low gain conditions respectively.

<<Structure of Low Noise Amplifier Otherwise Arranged>>

Figure 7:
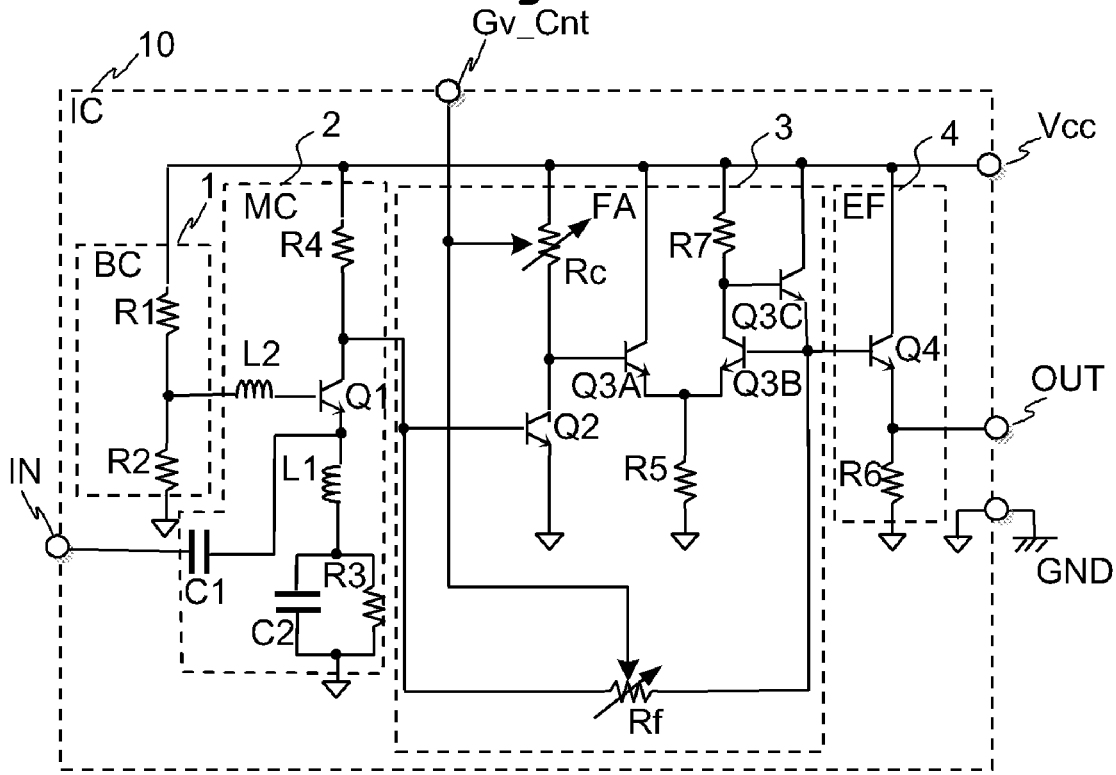
FIG. 7 is a diagram showing a low noise amplifier arranged in a semiconductor integrated circuit according to another embodiment of the invention.

FIG. 7 is a diagram showing a low noise amplifier arranged in a semiconductor integrated circuit (IC) 10 according to another embodiment of the invention. The low noise amplifier of FIG. 7 differs from the low noise amplifier of FIG. 4 in that the feedback emitter follower transistor Q3 of the variable gain resistive feedback amplifier 3 of FIG. 4 is replaced with a voltage follower for feedback including a differential pair transistors Q3A and Q3B, a load resistance R7, and a buffer transistor Q3C in FIG. 7.

<<Gain Dependence on Frequency of the Otherwise Arranged Low Noise Amplifier>>

Figure 8:
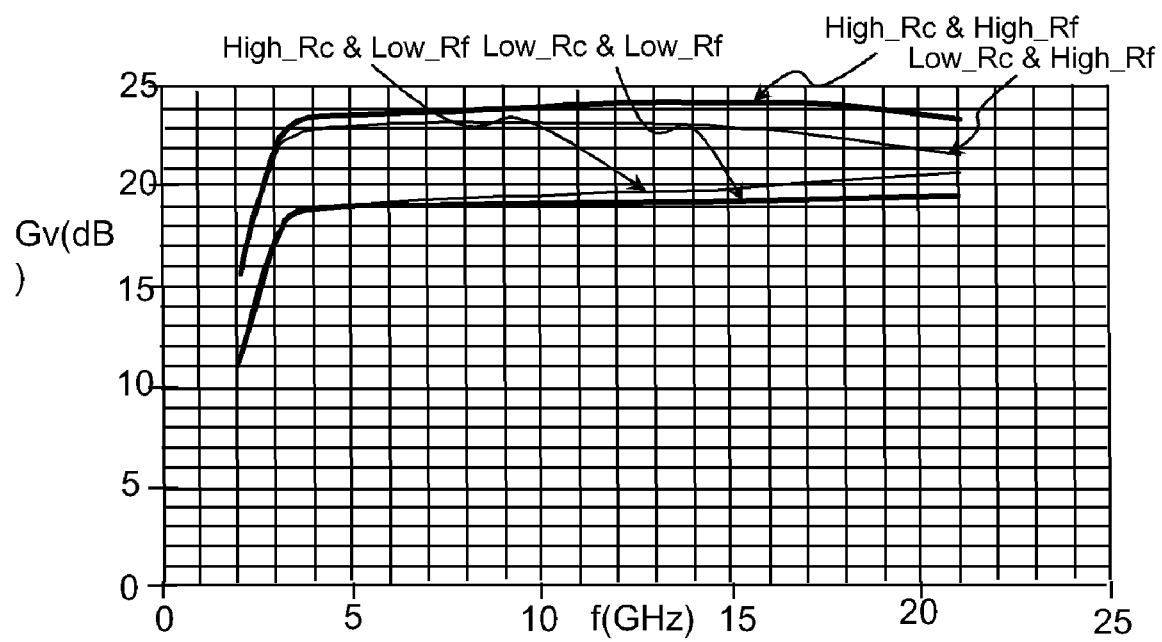
FIG. 8 is a diagram showing gain dependence on frequency of the low noise amplifier arranged in the semiconductor integrated circuit of FIG. 7.

FIG. 8 is a diagram showing gain dependence on frequency of the low noise amplifier arranged in the semiconductor integrated circuit 10 of FIG. 7. The results are gained from the simulation by the personal computer, too. As the feedback circuit of the low noise amplifier of FIG. 7 is composed of the high-performance voltage follower for feedback (Q3A, Q3B, R7, Q3C), gain dependencies on frequency of FIG. 8 are smaller than those of FIG. 6. However, their tendencies are exactly the same.

<<Structure of Low Noise Amplifier Otherwise Further Arranged>>

Figure 9:
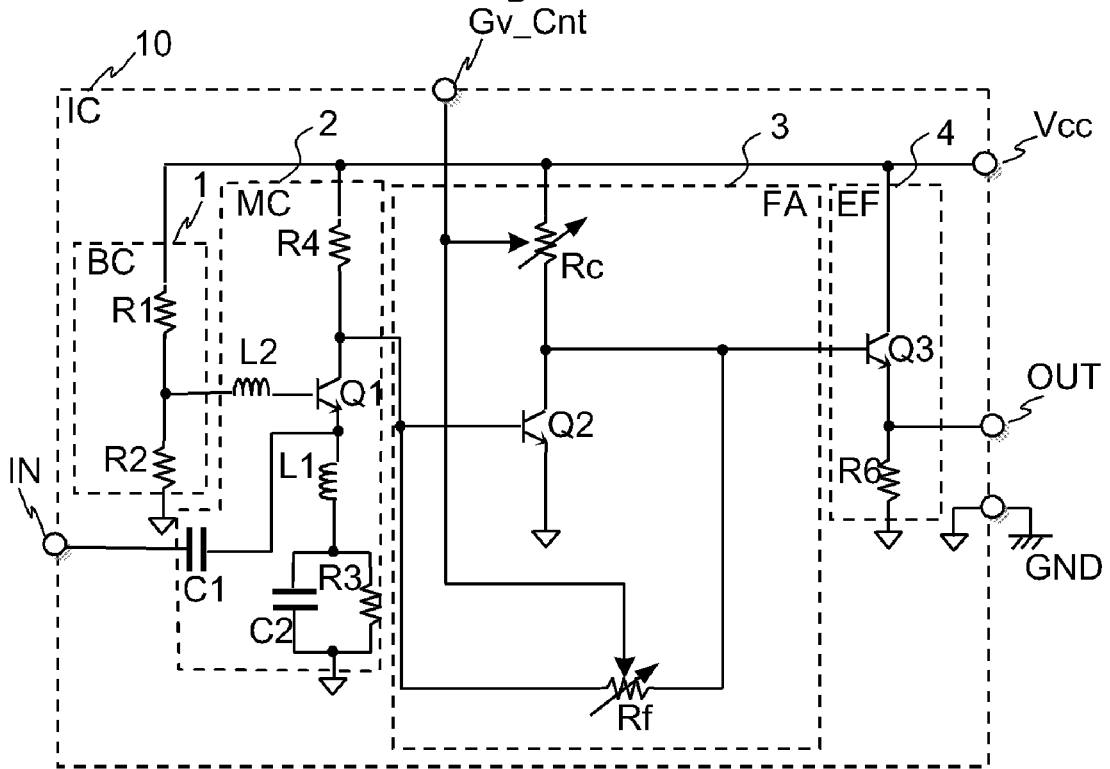
FIG. 9 is a diagram showing a low noise amplifier arranged in a semiconductor integrated circuit according to another embodiment of the invention.

FIG. 9 is a diagram showing a low noise amplifier arranged in a semiconductor integrated circuit (IC) 10 according to another embodiment of the invention. The low noise amplifier of FIG. 9 differs from the low noise amplifier of FIG. 4 in that the feedback emitter follower transistor Q3 of the variable gain resistive feedback amplifier 3 of FIG. 4 is omitted, and the output terminal of the transistor Q2 is connected to the feedback resistance Rf. This structure enables the reduction in power consumption because the current consumption by the transistor Q3 can be cut. However, as the separation by a voltage follower cannot be made between the parasitic capacitance of the output terminal of Q2 and the feedback resistance Rf, a time constant produced by the parasitic capacitance of the output terminal of Q2 is added and thus the feedback time constant τfb(c1) is increased. On this account, the frequency range that the gain remains substantially flat as shown in FIG. 6 is a lower frequency narrower range in comparison to the circuit arrangement of FIG. 4. However, even so, the effect resulting from such resistance control has the same tendency as that of FIG. 6.

Figure 11:
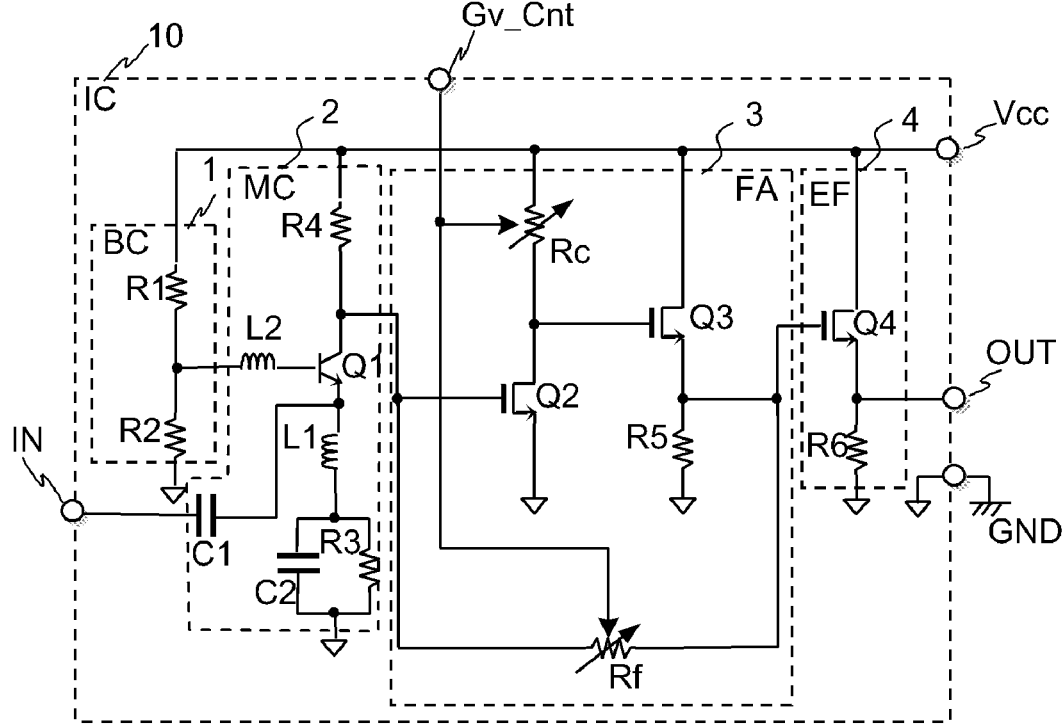
FIG. 11 is a diagram showing a low noise amplifier arranged in a semiconductor integrated circuit according to another embodiment of the invention.

FIG. 11 is a diagram showing a low noise amplifier arranged in a semiconductor integrated circuit (IC) 10 according to another embodiment of the invention. The low noise amplifier of FIG. 11 differs from the low noise amplifier of FIG. 4 in that the transistors Q2 to Q4 composed of SiGe heterojunction bipolar transistors of the variable gain resistive feedback amplifier 3 and output emitter follower 4 of FIG. 4 are replaced with N channel MOS transistors. Incidentally, for these N channel MOS transistors, N channel type MOS transistors of CMOS may be used.

Also, for the low noise amplifier of FIG. 11, the matching circuit 2 uses a common base transistor Q1 composed of a SiGe heterojunction bipolar transistor for the purpose of attaining a good noise figure performance. In the case where some deterioration in the noise figure performance is allowed, the common base transistor Q1 of the matching circuit 2 may be replaced with a common gate MOS transistor composed of an N channel MOS transistor.

<<Structure of MB-OFDM Supporting UWB Communication System>>

FIG. 12 is a diagram showing a structure of a UWB communication system of multi-band orthogonal frequency division multiplexing (MB-OFDM) according to another embodiment of the invention.

Figure 13:
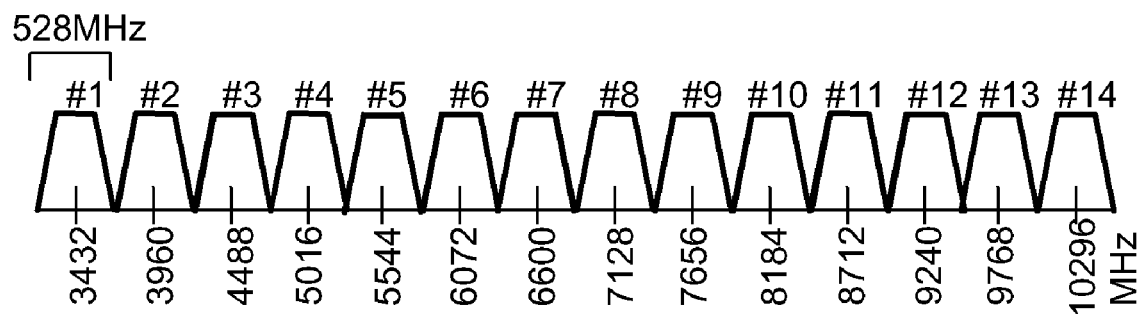
FIG. 13 is a diagram showing a frequency layout of a UWB wireless communication system for which MB-OFDM scheme is adopted.

FIG. 13 is a diagram showing a frequency layout of a UWB wireless communication system for which MB-OFDM scheme is adopted. As shown in FIG. 13, UWB frequencies are divided into first to fourteenth sub-bands; the first sub-band has a center frequency of 3432 MHz and a bandwidth of 528 MHz, and the fourteenth one has a center frequency of 10296 MHz and a bandwidth of 528 MHz.

The fourteen sub-bands are grouped in sets of three sub-bands, the resultant sub-bands groups consist of five groups formed by a group of the first to third sub-bands, a group of the fourth to sixth ones, a group of the seventh to ninth ones, a group of the tenth to twelfth ones, and a group of thirteenth and fourteenth ones. The center frequencies of the sub-bands are, in the frequency's ascending order, 3432, 3960, 4488, 5016, 5544, 6072, 6600, 7128, 7656, 8184, 8712, 9240, 9768, and 10296 (in units of MHz).

An RF signal belonging to one of the fourteen sub-bands is received by an antenna (ANT) 41 of the MB-OFDM supporting UWB communication system of FIG. 12. The antenna 41 is connected to a semiconductor integrated circuit 52 for processing a transmitted signal and a received signal through a switch (SW) 42 for changeover between transmission and reception.

The switch 42 connects between a received signal input terminal RXin and the antenna 41 during reception, and connects between a transmitted signal output terminal TXout and the antenna 41 during transmission. The switch 42 is composed of a duplexer which discriminates between a transmitted signal and a received signal, and appropriately couples the antenna 41 to the received signal input terminal RXin and the transmitted signal output terminal TXout.

The semiconductor integrated circuit 52 of FIG. 12 includes, as a receiver system, a variable gain wideband low noise amplifier (LNA) 43, a down-convert mixer (MIX) 45, and a receiver analog baseband circuit (RXBB) 49. As the variable gain wideband low noise amplifier 43, one of the low noise amplifiers of FIGS. 4, 7, 9 and 11 is used. The variable gain wideband low noise amplifier 43 amplifies an RF received input signal supplied through the received signal input terminal (RXin) from the switch 42.

That is, an RF received input signal received by the antenna 41 is supplied to the low noise amplifier 43 through the switch 42. The low noise amplifier 43 linearly amplifies the RF received input signal thus supplied with noise minimized. The down-convert mixer 45 mixes an RF received and amplified signal from the variable gain wideband low noise amplifier 43 and a receive local signal form a local oscillator 46, whereby a receiver analog baseband signal arises from the down-convert mixer 45.

The receiver analog baseband circuit 49 includes an A/D converter which converts the receiver analog baseband signal into a receive digital baseband signal. The receive digital baseband signal resulting from conversion by the A/D converter of the receiver analog baseband circuit 49 is processed by a digital baseband signal processing unit 51, and thus a received signal arises from a received signal output terminal RXout. This process is a demodulation process according to a predetermined demodulation-and-modulation scheme such as Quadrature phase shift keying (QPSK) or Orthogonal Frequency Division Multiplexing (OFDM).

The semiconductor integrated circuit 52 of FIG. 12 includes a digital baseband signal processing unit (DSP) 51 for transmission and reception and a local oscillator (LO) 46. The semiconductor integrated circuit 52 includes, as a transmitter system, a transmitter analog baseband circuit (TXBB) 50, an up-convert mixer (MIX) 47, and a transmitter RF power amplifier (PA) 44. Also, the semiconductor integrated circuit 52 includes a received signal strength indicator (RSSI) 48.

At the time of transmission, the digital baseband signal processing unit 51 modulates a transmitter signal supplied to the transmitted signal input terminal TXin according to a predetermined modulation-and-demodulation scheme, whereby a receive digital baseband signal is produced. The receive digital baseband signal produced by the digital baseband signal processing unit 51 is converted into a receiver analog baseband signal by a D/A converter of the transmitter analog baseband circuit 50. The up-convert mixer 47 mixes a transmitter analog baseband signal from the transmitter analog baseband circuit 50 and a transmitter local signal from the local oscillator 46. Thus, an RF received signal arises from the up-convert mixer 47. The RF received signal from the up-convert mixer 47 is amplified by the transmitter RF power amplifier 44. The resultant RF transmitter amplified signal from the transmitter RF power amplifier 44 is supplied to the antenna 41 through the transmitted signal output terminal TXout and switch 42.

In a receiving action of the MB-OFDM supporting UWB communication system of FIG. 12, the received signal strength indicator (RSSI) 48 measures the strength of an RF received input signal from a receiver analog baseband signal of the down-convert mixer 45. A value thus measured is supplied to the digital baseband signal processing unit 51. In Response to the measured value, the digital baseband signal processing unit 51 produces a gain control signal Gv_Cnt for the variable gain wideband low noise amplifier 43 of the receiver system and supplies it to the variable gain wideband low noise amplifier 43.

When the value measured by the received signal strength indicator 48 shows a weak signal strength, the digital baseband signal processing unit 51 supplies a gain control signal Gv_Cnt of the low level to the variable gain wideband low noise amplifier 43. As a result, the gain control signal Gv_Cnt of the low level raises the collector load resistance Rc of the variable gain wideband low noise amplifier 43 to the large resistance 300 ohms, and also raises the feedback resistance Rf to the large resistance 1200 ohms. In this way, the variable gain wideband low noise amplifier 43 is controlled to a high gain condition.

When the value measured by the received signal strength indicator 48 shows a strong signal strength, the digital baseband signal processing unit 51 supplies a gain control signal Gv_Cnt of the high level to the variable gain wideband low noise amplifier 43. As a result, the gain control signal Gv_Cnt of the high level lowers the collector load resistance Rc of the variable gain wideband low noise amplifier 43 to the small resistance 220 ohms, and lowers the feedback resistance Rf to the small resistance 700 ohms.

In this way, the variable gain wideband low noise amplifier 43 is controlled to a low gain condition. Therefore, the waveform distortion caused by waveform clipping by the variable gain wideband low noise amplifier 43 in a case of a strong signal strength can be reduced. Also, the gain dependence on frequency of the variable gain wideband low noise amplifier 43 can be reduced in a case of controlling the gain to high and low ones.

While the invention made by the inventor has been described above based on the embodiments specifically, the invention is not so limited. It is needless to say that various changes and modification may be made without departing from the subject matter hereof.

For example, the wideband variable amplifier of the invention is also applicable to a transimpedance amplifier of an optical fiber receiver. In the optical fiber receiver, received light from a piece of optical fiber is converted into electric current by a reversely biased photo diode.

This conversion current may be amplified in voltage in case that converted into a voltage by the transimpedance amplifier. An output of the transimpedance amplifier is supplied to a peak detector through a variable gain amplifier. As the transimpedance amplifier and variable gain amplifier, the wideband variable amplifier of the invention can be applied.

However, as the optical fiber receiver has no antenna, the matching circuit 2 for matching with an antenna is not required. In other words, as to the optical fiber receiver, the matching circuit 2 is omitted in any of the low noise amplifiers of FIGS. 4, 7, 9 and 11, and even so, the conversion current of the photo diode can be supplied to the base terminal of the common emitter transistor Q2 of the variable gain resistive feedback amplifier 3.

For a transimpedance amplifier and a variable gain amplifier for an optical fiber receiver with the data transfer rate of 20 Gb/s or higher, a wide bandwidth of 20 GHz or larger is required as their frequency bandwidths. The wideband variable amplifier of the invention can be utilized as such transimpedance amplifier and variable gain amplifier having a frequency bandwidth of 20 GHz or larger.

In addition to MB-OFDM supporting UWB communication systems, the wideband variable amplifier of the invention is also applicable to various types of RF line communication circuits including wireless LANs, serial type wire communication circuits and the like.

The variable resistor used for the collector load resistance Rc and feedback resistance Rf of the wide band variable low noise amplifier of the invention may be arranged so that the resistance value can be controlled to multiple values according to a control signal of multiple bits instead of being controlled to the two levels of high and low resistances according to low and high levels of a one-bit control signal.

What is claimed is:

1. A semiconductor integrated circuit comprising:
   a variable gain resistive feedback amplifier having a transistor for amplification, a load resistance, and a voltage follower for feedback,
   wherein a common terminal of an emitter or a source of the transistor for amplification is connected to a predetermined reference voltage,
   wherein an input signal is supplied to an input terminal of a base or gate of the transistor for amplification,
   wherein the load resistance is connected between an output terminal of a collector or drain of the transistor for amplification and a power supply voltage,
   wherein the output terminal of the transistor for amplification is connected with an input of the voltage follower for feedback,
   wherein a feedback resistance is connected between an output of the voltage follower for feedback and the input terminal of the transistor for amplification,
   wherein, in the variable gain resistive feedback amplifier, resistance values of the load resistance and feedback resistance are changed in response to a gain control signal in cooperation,
   wherein, when the load resistance is controlled to a high load resistance in response to the gain control signal setting the variable gain resistive feedback amplifier to a high gain, the feedback resistance is controlled to a high feedback resistance, and
   wherein, when the load resistance is controlled to a low load resistance, lower than the high load resistance, in response to the gain control signal setting the variable gain resistive feedback amplifier to a low gain, lower than the high gain, the feedback resistance is controlled to a low feedback resistance that is lower than the high feedback resistance.

2. The semiconductor integrated circuit according to claim 1, wherein the input signal supplied to the input terminal of the transistor for amplification at least includes a frequency bandwidth of about 3 to 10 GHz.

3. The semiconductor integrated circuit according to claim 1,
   wherein the transistor for amplification is a common emitter bipolar transistor, and
   wherein the voltage follower for feedback includes an emitter follower bipolar transistor.

4. The semiconductor integrated circuit according to claim 3, wherein the common emitter bipolar transistor and emitter follower bipolar transistor are silicon germanium heterojunction bipolar transistors.

5. The semiconductor integrated circuit according to claim 1,
   wherein the transistor for amplification is a common source field effect transistor, and
   wherein the voltage follower for feedback includes a source follower field effect transistor.

6. The semiconductor integrated circuit according to claim 5, wherein the common source field effect transistor and the source follower field effect transistor are MOS transistors.

7. The semiconductor integrated circuit according to claim 4,
   wherein a squared value of the high load resistance is substantially proportional to a value of the high feedback resistance, and
   wherein a squared value of the low load resistance is substantially proportional to a value of the low feedback resistance.

8. A semiconductor integrated circuit comprising:
   a matching circuit; and
   a variable gain resistive feedback amplifier including a transistor for amplification, a load resistance, a voltage follower for feedback, and a feedback resistance,
   wherein the matching circuit is supplied with an RF input signal received by an antenna of a receiver of a wireless system,
   wherein a common terminal of an emitter or a source of the transistor for amplification is connected to a predetermined reference voltage,
   wherein an output signal of the matching circuit is supplied to an input terminal of a base or a gate of the transistor for amplification,
   wherein the load resistance is connected between an output terminal of a collector or a drain of the transistor for amplification and a power supply voltage,
   wherein the output terminal of the transistor for amplification is connected to an input of the voltage follower for feedback,
   wherein the feedback resistance is connected between an output of the voltage follower for feedback and the input terminal of the transistor for amplification,
   wherein, in the variable gain resistive feedback amplifier, resistance values of the load resistance and feedback resistance are changed in response to a gain control signal in cooperation,
   wherein, when the load resistance is controlled to a high load resistance in response to the gain control signal setting the variable gain resistive feedback amplifier to a high gain, the feedback resistance is controlled to a high feedback resistance, and
   wherein, when the load resistance is controlled to a low load resistance, lower than the high load resistance, in response to the gain control signal setting the variable gain resistive feedback amplifier to a low gain, the feedback resistance is controlled to a low feedback resistance that is lower than the high feedback resistance.

9. The semiconductor integrated circuit according to claim 8,
   wherein the matching circuit includes a common base bipolar transistor having a base to which a base bias voltage is applied, an emitter supplied with the RF input signal received by the antenna, and a collector connected with the transistor for amplification, and
   wherein the matching circuit performs matching of input impedance with the antenna.

10. The semiconductor integrated circuit according to claim 9, wherein the RF input signal supplied to the emitter of the common base bipolar transistor of the matching circuit is an ultra wideband RF input signal at least including a frequency bandwidth gang of about 3 to 10 GHz.

11. The semiconductor integrated circuit according to claim 8,
    wherein the transistor for amplification is a common emitter bipolar transistor, and
    wherein the voltage follower for feedback includes an emitter follower bipolar transistor.

12. The semiconductor integrated circuit according to claim 11, wherein the common base bipolar transistor, the common emitter bipolar transistor, and the emitter follower bipolar transistor are silicon germanium heterojunction bipolar transistors.

13. The semiconductor integrated circuit according to claim 8,
wherein the transistor for amplification is a common source field effect transistor, and
wherein the voltage follower for feedback includes a source follower field effect transistor.

14. The semiconductor integrated circuit according to claim 13, wherein the common source field effect transistor and source follower field effect transistor are MOS transistors.

15. The semiconductor integrated circuit according to claim 12,
wherein a squared value of the high load resistance is substantially proportional to a value of the high feedback resistance, and
wherein a squared value of the low load resistance is substantially proportional to a value of the low feedback resistance.

16. The semiconductor integrated circuit according to claim 8, further comprising:
an output voltage follower;
a receiver mixer;
a baseband signal processing unit; and
a received signal strength indicator,
wherein the output voltage follower is supplied with an output signal of the variable gain resistive feedback amplifier,
wherein the receiver mixer is supplied with an output signal of the output voltage follower,
wherein the baseband signal processing unit is supplied with a receiver baseband signal from the receiver mixer, and
wherein the received signal strength indicator is supplied with the receiver baseband signal from the receiver mixer, whereby the gain control signal supplied from the received signal strength indicator to the variable gain resistive feedback amplifier is produced.

17. The semiconductor integrated circuit according to claim 16, wherein the output voltage follower includes an output emitter follower bipolar transistor.

18. The semiconductor integrated circuit according to claim 17, wherein the output emitter follower bipolar transistor is also a silicon germanium heterojunction bipolar transistor.

19. The semiconductor integrated circuit according to claim 16, wherein the output voltage follower includes an output source follower field effect transistor.

20. The semiconductor integrated circuit according to claim 19, wherein the output source follower field effect transistor is a MOS transistor.

* * * * *